United States Patent
Kim

(10) Patent No.: US 7,783,941 B2
(45) Date of Patent: *Aug. 24, 2010

(54) MEMORY DEVICES WITH ERROR DETECTION USING READ/WRITE COMPARISONS

(75) Inventor: Hyung-Gon Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 514 days.

This patent is subject to a terminal disclaimer.

(21) Appl. No.: 11/009,826

(22) Filed: Dec. 10, 2004

(65) Prior Publication Data

US 2006/0053361 A1    Mar. 9, 2006

(30) Foreign Application Priority Data

Sep. 6, 2004    (KR)    ...................... 10-2004-0070944

(51) Int. Cl.
*G11C 29/00*    (2006.01)
(52) U.S. Cl. .................. 714/711; 714/718; 714/735
(58) Field of Classification Search ................ 714/711, 714/718, 719, 735, 736, 738, 739, 766, 768, 714/769; 365/200, 185.03, 185.09
See application file for complete search history.

(56) References Cited

U.S. PATENT DOCUMENTS

| 4,688,219 | A | * | 8/1987 | Takemae | ..................... 714/711 |
| 5,181,207 | A | * | 1/1993 | Chapman | ..................... 714/755 |
| 5,425,038 | A | | 6/1995 | Chen | |
| 6,181,614 | B1 | * | 1/2001 | Aipperspach et al. | ....... 365/200 |
| 6,262,926 | B1 | * | 7/2001 | Nakai | .......................... 365/200 |
| 6,331,945 | B1 | * | 12/2001 | Shibata et al. | .......... 365/185.03 |
| 6,990,623 | B2 | * | 1/2006 | Furukawa | ................... 714/773 |
| 7,260,670 | B2 | * | 8/2007 | Kawai | ......................... 711/100 |
| 2003/0117846 | A1 | * | 6/2003 | Hasegawa et al. | ...... 365/185.09 |

FOREIGN PATENT DOCUMENTS

| JP | 54-162933 | 12/1979 |
| JP | 02-037447 | 2/1990 |
| JP | 03-104096 | 5/1991 |
| JP | 05-189997 | 7/1993 |
| JP | 05-225070 | 9/1993 |
| JP | 06-052698 | 2/1994 |
| JP | 06-089236 | 3/1994 |
| JP | 08-137763 | 5/1996 |
| JP | 11-203892 | 7/1999 |
| JP | 2001-273198 | 10/2001 |
| KR | 2002007414 | 1/2002 |
| KR | 1020040002143 A | 1/2004 |
| KR | 102004007557 A | 8/2004 |
| WO | WO0070459 | 11/2000 |

* cited by examiner

*Primary Examiner*—Fritz Alphonse
(74) *Attorney, Agent, or Firm*—Myers Bigel Sibley & Sajovec, PA

(57) ABSTRACT

A memory device includes a main memory cell array and a redundant memory cell array configured to store a first parity code for data stored in the main memory cell array. The device further includes a parity generator configured to generate a second parity code responsive to reading of the stored data from the main memory cell array, and a comparator configured to compare the first and second parity codes. In some embodiments, the parity generator configured to generate the second parity code during a copyback operation.

23 Claims, 6 Drawing Sheets

MEMORY DEVICES WITH ERROR DETECTION USING READ/WRITE COMPARISONS

RELATED APPLICATION

This application claims the priority of Korean Patent Application No. 2004-70944, filed on Sep. 6, 2004 in the Korean Intellectual Property Office, the disclosure of which is incorporated herein in its entirety by reference.

BACKGROUND OF THE INVENTION

The present invention relates to integrated circuit memory devices and, more particularly, to integrated circuit memory devices with error detection capabilities.

Generally, semiconductor memory devices are classified into random access memories (RAMs) and read only memories (ROMs). RAMs are volatile memory devices that lose their stored data when their power supplies are interrupted, while the ROMS are non-volatile memory devices that can hold their stored data even when their power supplies are interrupted. RAMs include dynamic RAM (DRAM) and static RAM (SRAM), and ROMs include programmable ROM (PROM), erasable PROM (EPROM), electrically EPROM (EEPROM), and flash memory.

Typically, flash memory devices are classified into NAND flash memory devices and NOR flash memory devices. A typical NAND flash memory device is divided into a plurality of blocks, each having a plurality of pages. Each page includes a plurality of memory cells sharing a wordline. For example, each of the blocks may have 16, 32 or 64 pages, each having 512 or 2048 bytes of memory cells. A typical NAND flash memory device performs read and write (or program) operations for each page and performs an erase operation for each block.

A NAND flash memory device may support a copyback operation as well as read/write/erase operations. In a copyback operation, data stored in a first page (or source page) is copied to a second page (or target page). For a copyback operation, data stored in a source page typically is temporarily stored in a page buffer, and the temporarily stored data is re-stored in a target page without being read to the outside of the memory device. Use of the copyback operation makes it possible to omit reading out data of a source page and re-loading the data externally, which can enhance an operating speed of the NAND flash memory device.

However, a one-bit error may occur when reading data from a source page, and a one-bit error may additionally occur when programming (writing) the data in a target page. Hence, a 2-bit error may occur in copyback operation. In a typical NAND flash memory device, a memory controller may be capable of correcting only one-bit errors for a page. Consequently, if a 2-bit error occurs for a page during a copyback operation, it may not be possible to conduct successful error correction.

SUMMARY OF THE INVENTION

In some embodiments of the present invention, a memory device includes a main memory cell array and a redundant memory cell array configured to store a first parity code for data stored in the main memory cell array. The device further includes a parity generator configured to generate a second parity code responsive to reading of the stored data from the main memory cell array, and a comparator configured to compare the first and second parity codes. The main memory cell array and the redundant memory cell array may include NAND flash memory cell arrays. The parity generator may be configured to generate the second parity code during a copyback operation. The first and second parity codes may be 1-bit parity codes.

In further embodiments, the parity generator includes a first parity generator and the memory device further includes a second parity generator configured to generate the first parity code responsive to provision of the data to the main memory cell array. The device may further include a repair memory cell array configured for repair of the redundant memory cell array, along with means, such as a fuse circuit, for selecting the redundant memory cell array or the repair memory cell array.

In further embodiments of the present invention, a memory device includes a memory cell array, a first parity generator configured to generate a first parity code responsive to input of data to the memory cell array, and a second parity generator configured to generate a second parity code responsive to output of data from the memory cell array. The device further includes a comparator configured to compare the first and second parity codes. The second parity generator may be configured to generate the second parity code responsive to a copyback operation. The memory cell array may include a main memory cell array, and the device may further include a redundant memory cell array configured to store the first parity code. The first and second parity codes may be 1-bit parity codes.

In method embodiments, errors in a memory device may be detected by generating a first parity code responsive to input of data to a memory cell array, generating a second parity code responsive to output of the data from the memory cell array, and comparing the first and second parity codes to detect an error. The second parity code may be generated responsive to a copyback operation. The first parity code may be stored in a redundant memory cell array.

DETAILED DESCRIPTION OF EXEMPLARY EMBODIMENTS

The present invention will now be described more fully with reference to the accompanying, in which embodiments of the invention are shown. This invention may, however, be embodied in different forms and should not be construed as being limited to the embodiments set forth herein. Rather, these embodiments are provided so that this disclosure will be thorough and complete, and will fully convey the scope of the invention to those skilled in the art. Like numbers refer to like elements. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
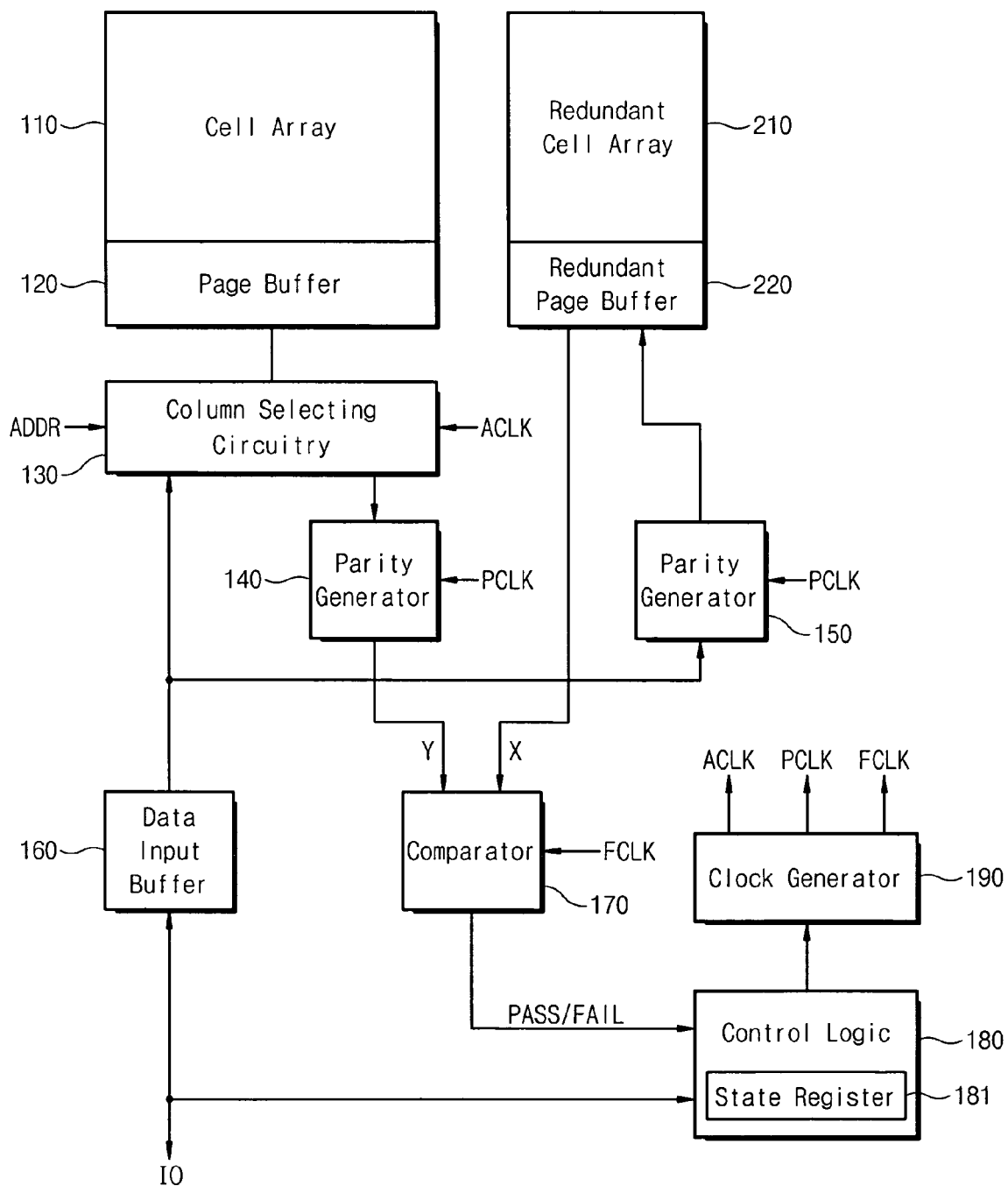
FIG. 1 is a block diagram of a semiconductor memory device according to some embodiments of the present invention.

FIG. 1 illustrates an integrated circuit (semiconductor) memory device according to some embodiments of the present invention. A NAND flash memory device 100 includes a main memory cell array 110, a page buffer 120, a column selecting circuitry 130, parity generators 140 and 150, a data input buffer 160, a comparator 170, control logic 180, a clock generator 190, a redundant memory cell array 210, and a redundant page buffer 220. The main memory cell array 110 performs read and write operations for page data. The page buffer 120 temporarily stores data to be written in the memory cell array 110 or data read out from the main memory cell array 110. The column selecting circuitry 130 accesses a selected bitline in response to an externally applied column address ADDR and address clock signal ACLK. The column selecting circuitry 130 includes a Y-gate circuit, a column decoder, and an address counter. Configurations of the main memory cell array 110, the page buffer 120, and the column selecting circuitry 130 may be conventional configurations well known to those skilled in the art, and will not be described in further detail.

The redundant memory cell array 210 is configured to store an error detection code (EDC), more particularly, a parity code. In the illustrated embodiments, the parity code represents one-bit error data for a page of the main memory cell array 110. The redundant page buffer 220 temporarily stores the parity code to be stored in the redundant memory cell array 210.

The parity generators 140 and 150 generate the one-bit parity code from m-bit data (m being a natural number) in response to a parity clock signal PCLK. The parity generator 150 receives m-bit data from the data input buffer 160 when data is input and responsively generates a one-bit parity code. The parity generator 140 receives m-bit data from the column selecting circuitry 130 during a data output operation and responsively generates a one-bit parity code. The parity generators 140 and 150 may have the same configuration, as described in detail later with reference to FIG. 2.

Still referring to FIG. 1, an error detecting operation of the NAND flash memory device 110 will now be described. If m-bit data is input through the data input buffer 160, the input data is provided to the column selecting circuitry 130 and the parity generator 150. The column selecting circuitry 130 transmits the data to a selected bitline in response to an externally applied column address ADDR. After the transmitted data is temporarily stored in the page buffer 120, it is stored in a source page of the main memory cell array 110.

The first parity generator 150 generates a one-bit parity code from the provided m-bit data. After the generated parity code is temporarily stored in the redundant page buffer 220, it is stored in the redundant memory cell array 210.

In a copyback operation, the NAND flash memory device 100 reads data stored in a source page and stores the data in the page buffer 120 and the redundant page buffer 220. When reading the data stored in the source page of the main memory cell array 110, a one-bit error may occur. Data is temporarily stored in the page buffer 120 and the redundant page buffer 220 and then is re-programmed to a target page. The data stored in the page buffer 120 is also input to the parity generator 140 through the column selecting circuitry 130. The parity generator 140 generates a one-bit parity code responsive to the data in the page buffer 120.

The comparator 170 compares the parity code generated by the parity generator 140 with the parity code stored in the redundant page buffer 220 to check whether a failure has occurred in reading the source page. If a failure is not detected, a pass signal PASS is generated. If a failure is detected, i.e., if the parity codes do not match, a fail signal FAIL is generated. The pass or fail signal is stored in the state register 181 of the control logic 180 and is output from the device 100 through an input/output line.

Figure 2:
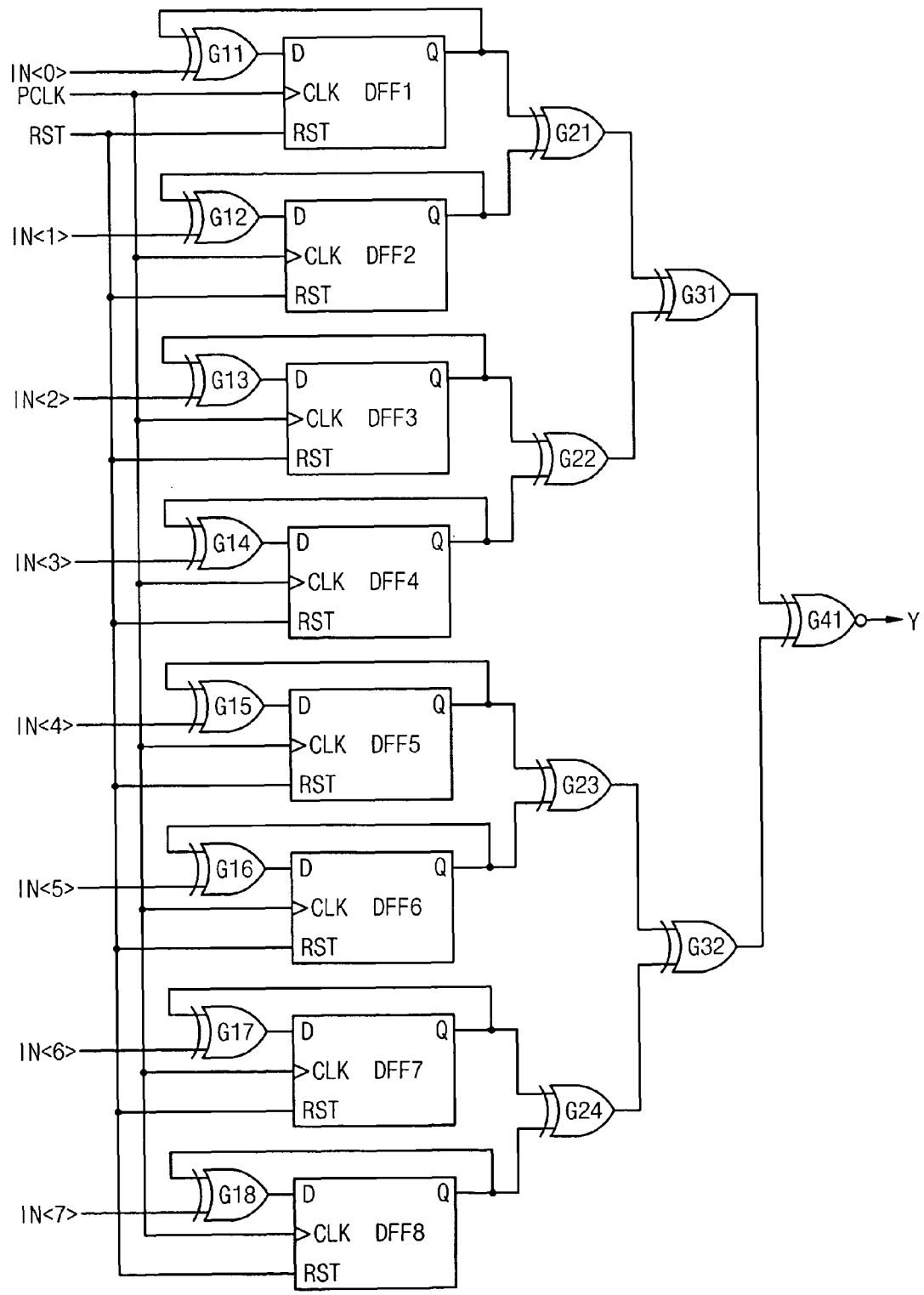
FIG. 2 is a circuit diagram illustrating an exemplary implementation of a parity generator shown in FIG. 1 according to further embodiments of the present invention.

As illustrated in FIG. 2, a parity generator 140 according to some embodiments of the present invention includes a first group of XOR gate G11-G18, eight flip-flops DFF1-DFF8, a second group of XOR gates G21-G24, a third group of XOR gates G31-G32, and an XNOR gate G41. Each of the first group of the XOR gates G11-G18 has two input terminals. One of the input terminals receives data from the column selecting circuitry 130, and the other receives data from the flip-flops DFF1-DFF8. Output terminals of the first group of the XOR gates G11-G18 are connected to inputs of the flip-flops DFF1-DFF8, respectively. The flip-flops DFF1-DFF8 are initialized by a reset signal RST, and are clocked by a parity clock signal PCLK to synchronize output data received from the output terminals of the first group of the XOR gates G11-G18.

Each of the second group of the XOR gates G21-G24 has two input terminals coupled to the output terminals of adjacent pairs of the flip-flops DFF1-DFF8. In particular, output terminals of first and second flip-flops DFF1 and DFF2 are coupled to an input terminal of an XOR gate G21; output terminals of third and fourth flip-flops DFF3 and DFF4 are coupled to an input terminal of an XOR gate G22; output terminals of fifth and sixth flip-flops DFF5 and DFF6 are coupled to an input terminal of an XOR gate G23; and output terminals of seventh and eighth flip-flops DFF7 and DFF8 are coupled to an input terminal of an XOR gate G24.

The XOR gates G31-G32 each have two input terminals coupled to the second group of the XOR gates G21-G24. The XNOR gate G41 has two input terminals coupled to output terminals of the third group of the XOR gates G31-G32. The XNOR gate G41 generates a one-bit parity code Y at its output terminal.

The parity generator 140 shown in FIG. 2 receives 8-bit data. The received data is synchronized with a parity clock signal PCLK. The parity generator 140 indicates whether the number of binary "1s" in the input data IN<0>~IN<7> is an odd number or an even number. If the number of "1" bits is odd, a parity code "0" is generated; if the number of "1" bits is even, a parity code "1" is generated.

Figure 3:
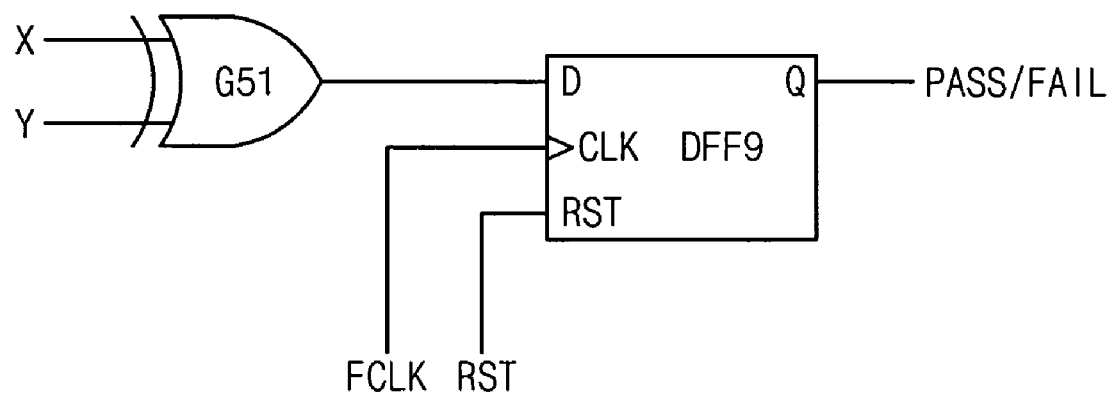
FIG. 3 is a circuit diagram of an exemplary implementation of a comparator shown in FIG. 1 accordingly to further embodiments of the present invention.

As illustrated in FIG. 3, a comparator 170 according to some embodiments of the present invention includes an XOR gate G51 and a flip-flop DFF9. The XOR gate G51 has two input terminals. One of the terminals receives a one-bit parity code X from a redundant page buffer 220, and the other receives a one-bit parity code Y from a parity generator 140. If the parities X and Y are identical, a "0" is output; if not, a "1" is output.

The data output from the XOR gate G51 is input to the flip-flop DFF9. The flip-flop DFF9 is initialized by a reset signal RST and is clocked by a clock signal FCLK to synchronize the received data from the XOR gate G51. If the data output from the flip-flop DFF9 is "0", it is a pass signal PASS; if not, it is a fail signal FAIL.

The memory device 100 generates one-bit parity when data is input and stored in the redundant memory cell array 210. In order to detect an error generated while reading the data stored in the main memory cell array 110, the parity generator 140 is provided to generate one-bit parity. The one-bit parity is compared with the parity generated when data is input, detecting an error generated while reading data. Although, a copyback operation of a semiconductor memory device has been described with reference to specific embodiments of the present invention, it will be understood that the semiconductor memory device according to the invention is not limited to the details thereof.

Figure 4:
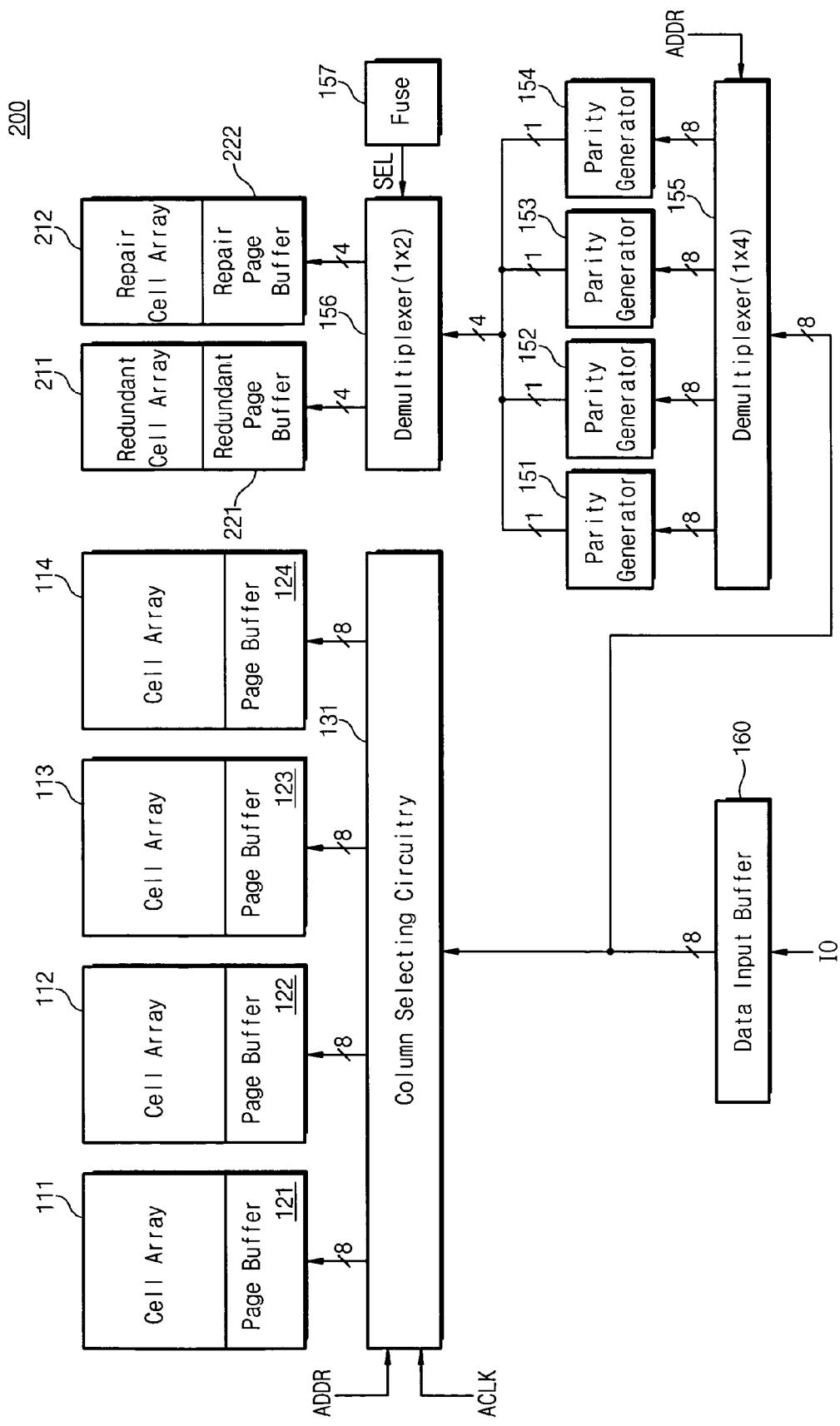
FIG. 4 and FIG. 5 are block diagrams of a memory device according to additional embodiments of the present invention.
Figure 5:
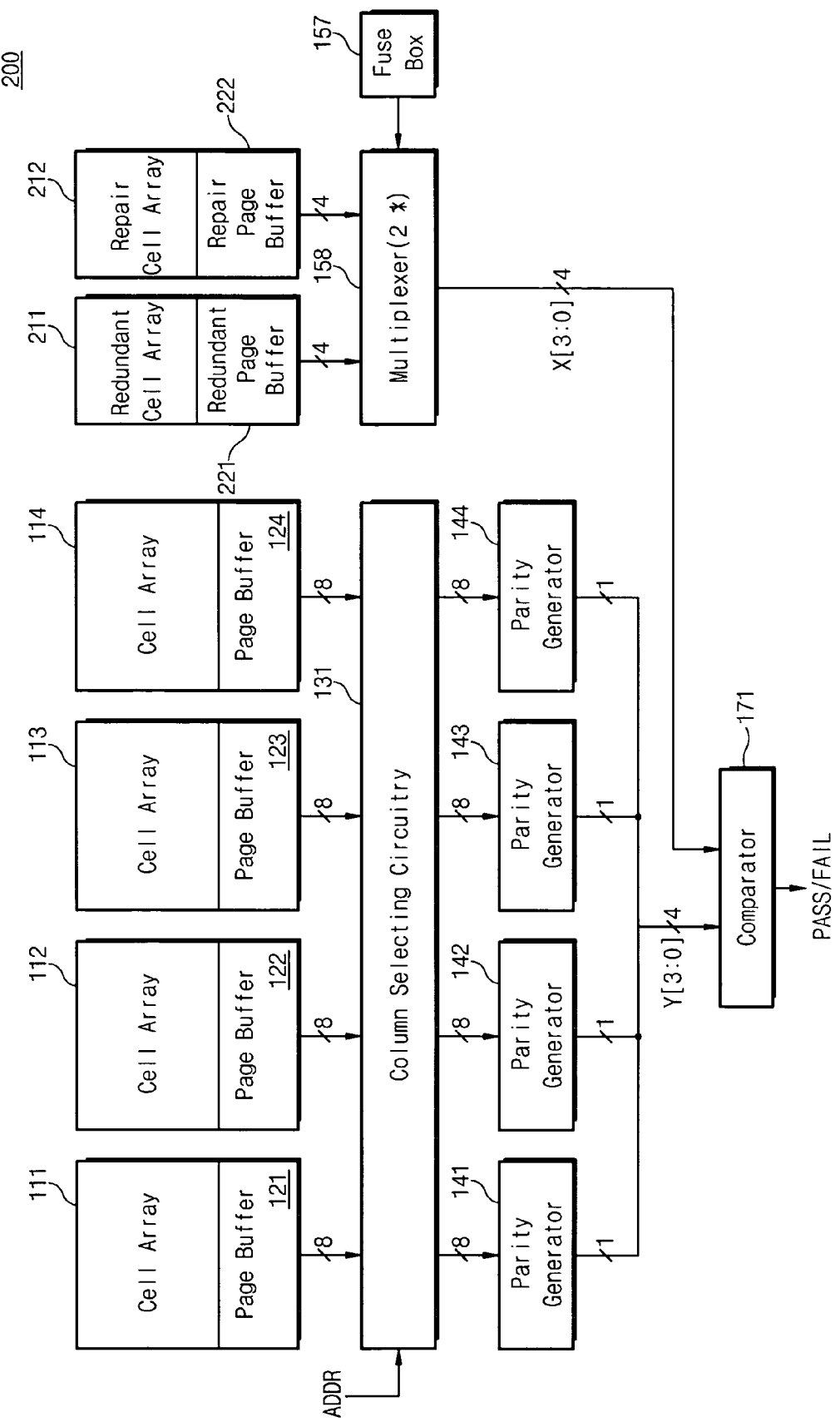

FIG. 4 and FIG. 5 illustrate a semiconductor memory device 200 according to further embodiments of the present invention. In FIGS. 1, 4 and 5, like numerals denote like components, further description of which is omitted in view of the prior description of FIG. 1. FIG. 4 is a block diagram showing generation of a 4-bit parity code corresponding to respective memory cell arrays when data is input, and FIG. 5 is a block diagram showing generation of a 4-bit parity code corresponding to respective memory cell arrays during a copyback operation.

As illustrated in FIG. 4 and FIG. 5, the NAND flash memory device 200 includes four main memory cell arrays 111-114, four page buffers 121-124, column selecting circuitry 131, four first parity generators 151-154, four second parity generators 141-144, demultiplexers 155 and 156, a fuse circuit 157, a multiplexer 158, a data input buffer 160, a comparator 171, a redundant memory cell array 211, a repair memory cell array 212, a redundant page buffer 221, and a repair page buffer 222. Referring to FIG. 4, the data input buffer 160 receives m-bit (e.g., 8-bit) data through an input/output line IO. The column selecting circuitry 131 transmits data to the four main memory cell arrays 111-114 in response to an externally applied column address ADDR and an address clock signal ACLK. The transmitted data is temporarily stored in the four page buffers 121-124, and is programmed in a source page in response to a program command.

The demultiplexer 155 provides the input data from the data input buffer 160 to the first parity generators 151-154. The first parity generators 151-154 generate respective one-bit parity codes corresponding to the respective main memory cell arrays 111-114. For example, a parity generator 151 generates a one-bit parity code relative to data stored in a source page of a memory cell array 111. The 4-bit parity code generated by the first parity generators 151-154 is input to the demultiplexer 156. The first parity generators 151-154 may have the same circuit configuration as the parity generator shown in FIG. 2.

The demultiplexer 156 selects a redundant memory cell array 211 or a repair memory cell array 212 in response to a selection signal SEL provided from the fuse circuit 157, and transmits a 4-bit parity code to the selected memory cell array. An exemplary configuration of the fuse circuit 157 will be described in detail later with reference to FIG. 7.

The redundant memory cell array 211 has four redundant columns corresponding to four main memory cell arrays 111-114 and may store a 4-bit parity code. After the 4-bit data is temporarily stored in a redundant page buffer 221, it is programmed to the redundant memory cell array 211 in response to a program command. The repair memory cell array 212 is used to replace defect cells of the redundant memory cell array 211. If a defect occurs at the redundant memory cell array 211, a fuse in the fuse circuit 157 is connected to store a 4-bit parity code in the repair memory cell array 212. After the 4-bit parity code is temporarily stored in the repair page buffer 222, it is programmed to the repair memory cell array 212 in response to a program command.

FIG. 5 is a block diagram illustrating generation of a 4-bit parity code during a copyback operation for data and comparison with a 4-bit parity code previously generated when the data was input. The copyback operation includes a read operation in which data stored a source page is read out to a page buffer, a program operation in which the data stored in the page buffer is programmed to a target page, and a program verify operation to check whether the programming was successful.

When the copyback operation starts, the data stored in the main memory cell arrays 111-114 and the source page of the redundant memory cell array 211 is stored in the page buffers 121-124 and the redundant page buffer 221. While reading the data stored in the source page, a one-bit error may occur.

The data, which is temporarily stored in the page buffers 121-124 and the redundant page buffer 221, is re-programmed (written) in a target page. While the data stored in a page buffer is programmed, it is input to parity generators 141-144 through the column selection circuit 131. The parity generators 141-144 generate a 4-bit parity code relative to data transferred from a source page to the page buffers 121-124.

The comparator 171 compares the 4-bit parity code generated by the parity generators 141-144 with the 4-bit parity code stored in the redundant page buffer 221 to detect whether a failure has occurred while reading the data stored in the source page. If the parity codes match each other, a pass signal PASS is generated; if not, a fail signal FAIL is generated. The pass or fail signal is stored in a state logic 181 of the control logic 180 (see FIG. 1) and is output from the device through an input/output line.

Figure 6:
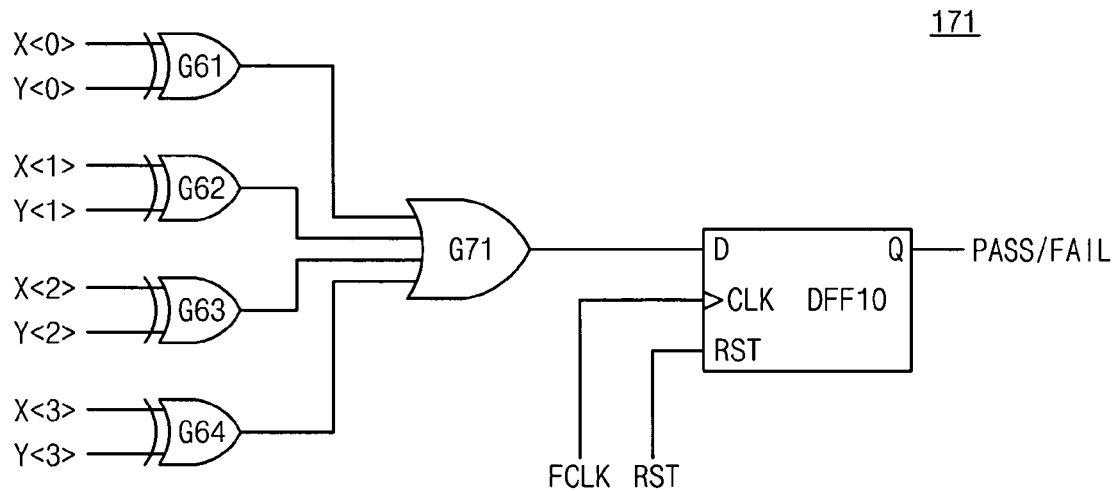
FIG. 6 is a circuit diagram of an exemplary implementation of a comparator shown in FIG. 5 according to some embodiments of the present invention.

As illustrated in FIG. 6, an exemplary implementation of the comparator 171 includes four XOR gates G61-G64, an OR gate G71, and a flip-flop DFF10. Each of the XOR gates G61-G64 has two input terminals. One of the input terminals receives a parity code generated by parity generators 141-144, and the other receives a parity code stored in a redundant page buffer 221. The OR gate G71 has four input terminals coupled to output terminals of the XOR gates G61-G64. The flip-flop DFF10 is synchronized with a clock signal FCLK and responsively generates a pass signal or a fail signal. The operating principle of the comparator 171 is substantially the same as that of the comparator 170 shown in FIG. 3.

Figure 7:
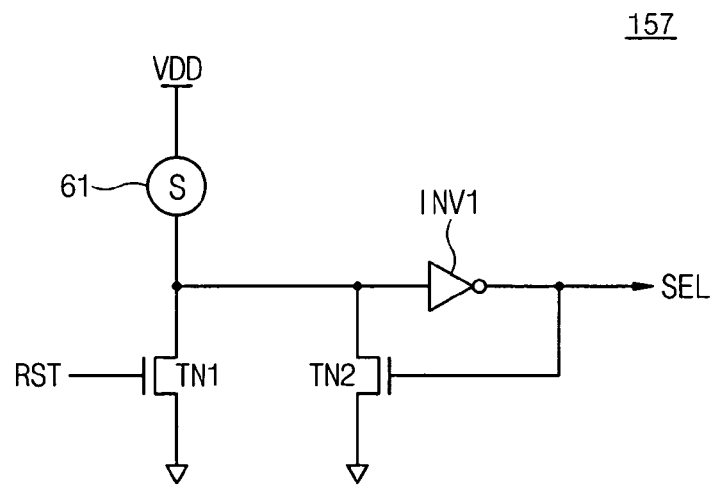
FIG. 7 is a circuit diagram of an exemplary implementation of a fuse circuit shown in FIG. 4 and FIG. 5 according to further embodiments of the present invention.

As illustrated in FIG. 7, an exemplary fuse circuit 157 includes a fuse 61. A logic level of a selection signal SEL is determined depending upon whether or not the fuse 61 is cut. If the fuse 61 is cut, a transistor TN1 is turned on in response to a high level of a reset signal RST, causing an input terminal of an inverter INV1 to go to a logic low level, i.e., if the fuse 61 is cut, the selection signal SEL is activated high. If the fuse 61 is intact, a power supply voltage VDD is supplied through the fuse 61. Thus, while the transistor TN1 is turned off, an input terminal of the inverter INV1 is kept at a high level to generate a selection signal SEL of "low level" from an output terminal of the inverter INV1.

Returning to FIG. 4 and FIG. 5, in the event that the fuse 61 in the fuse box 157 is intact, the demultiplexer 156 and the multiplexer 158 allow the redundant memory cell array 211 and the redundant page buffer 221 to be activated. In the event that the fuse 61 in the fuse box 157 is cut, the demultiplexer 156 and the multiplexer 158 allow the repair memory cell array 212 and the repair page buffer 222 to be activated.

In the embodiments of the present invention illustrated in FIGS. 4-7, the NAND flash memory device 200 generates a 4-bit parity code corresponding to a plurality of memory cell arrays when data is input and stores the parity code in a redundant memory cell array 210. During a copyback operation, a second 4-bit parity code is generated. This 4-bit parity code is compared with the previously generated parity code to detect whether an error has occurred while reading the data stored in a source page. While a NAND flash memory device that includes four memory cell arrays is shown in FIG. 4 through FIG. 7, it will be appreciated that the number of memory cell arrays may vary.

Although the present invention has been described with relation to a NAND flash memory device, it will be understood that the invention may be applied to other semiconductor memory devices. Further, various substitutions and modifications may be made without departing from the scope and sprit of the invention as defined in the appended claims.

What is claimed is:

1. A memory device comprising:
   a main memory cell array;
   a redundant memory cell array configured to store a first parity code for data stored in the main memory cell array;
   a first parity generator configured to generate the first parity code responsive to input of the data to the main memory cell array;
   a second parity generator configured to generate a second parity code responsive to reading of the stored data from the main memory cell array during a copyback operation; and
   a comparator configured to compare the first and second parity codes.

2. The memory device of claim 1, wherein the main memory cell array and the redundant memory cell array comprise NAND flash memory cell arrays.

3. The memory device of claim 1, further comprising a repair memory cell array configured for repair of the redundant memory cell array.

4. The memory device of claim 3, wherein the repair memory cell array has the same cell configuration as the redundant memory cell array.

5. The memory device of claim 3, further comprising means for selecting the redundant memory cell array or the repair memory cell array.

6. The memory device of claim 5, wherein the selecting means comprises a fuse circuit.

7. The memory device of claim 1, wherein each of the first and second parity codes is a one-bit parity code.

8. The memory device of claim 1, wherein the main memory cell array is divided into a plurality of memory cell arrays.

9. The memory device of claim 8, wherein the first and second parity codes comprise parity codes having the same number of bits as the number of the plurality of memory cell arrays.

10. A memory device comprising:
    a memory cell array;
    a first parity generator configured to generate a first parity code responsive to input of data to the memory cell array;
    a second parity generator configured to generate a second parity code responsive to output of data from the memory cell array; and
    a comparator configured to compare the first and second parity codes,
    wherein the memory cell array comprises a main memory cell array, and further comprising a redundant memory cell array configured to store the first parity code.

11. The memory device of claim 10, wherein the memory cell array comprises a NAND flash memory cell array.

12. The memory device of claim 11, wherein the second parity generator is configured to generate the second parity code responsive to a copyback operation.

13. The memory device of claim 10, wherein the first and second parity codes are each 1-bit parity codes.

14. The memory device of claim 10, wherein the main memory cell array comprises a plurality of memory cell arrays.

15. The memory device of claim 10, wherein the first and second parity codes have the same number of bits as the number of the plurality of memory cell arrays.

16. A method for detecting errors in an integrated circuit memory device, comprising the following operations performed in the integrated circuit memory device:
    generating a first parity code in the integrated circuit memory device responsive to input of data to be written to a memory cell array of the memory device;
    generating a second parity code in the integrated circuit memory device responsive to reading of the data from the memory cell array; and
    comparing the first and second parity codes in the integrated circuit memory device to detect an error.

17. The method of claim 16, wherein the memory device is a NAND flash memory device.

18. The method of claim 17, wherein generating a second parity code comprises generating the second parity code responsive to a copyback operation.

19. The method of claim 16, wherein generating the first parity code comprises generating the first parity code using a first parity generator, and wherein the method further comprises:
    storing the data to be written to the memory cell array in the memory cell array; and
    storing the first parity code in a redundant memory cell array of the memory device.

20. The method of claim 19, further comprising repairing the redundant memory cell array.

21. The method of claim 19, wherein generating the second parity code comprises:
    reading the written data from the memory cell array; and
    generating the second parity code from the read data using a second parity generator.

22. The method of claim 21, where comparing the first and second parity codes comprises:

reading the first parity code from the redundant memory cell array; and comparing the first and second parity codes.

23. The method of claim 16, wherein the memory cell array comprises a plurality of memory cell arrays, and wherein the first and second parity codes have the same number of bits as the number of the plurality of memory cell arrays.

* * * * *